United States Patent
Tabor et al.

(10) Patent No.: US 10,428,234 B2
(45) Date of Patent: Oct. 1, 2019

(54) LIQUID METAL INK

(71) Applicant: Government of the United States, as represented by the Secretary of the Air Force, Wright-Patterson AFB, OH (US)

(72) Inventors: Christopher E. Tabor, Kettering, OH (US); Michael F. Durstock, West Chester, OH (US); James R. Deneault, Kettering, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 15/713,955

(22) Filed: Sep. 25, 2017

(65) Prior Publication Data

US 2019/0092955 A1   Mar. 28, 2019

(51) Int. Cl.
| | |
|---|---|
| *C09D 11/52* | (2014.01) |
| *B05B 7/00* | (2006.01) |
| *B05B 7/04* | (2006.01) |
| *C22C 28/00* | (2006.01) |
| *H05K 3/12* | (2006.01) |
| *B05B 7/26* | (2006.01) |
| *C09D 11/322* | (2014.01) |

(52) U.S. Cl.
CPC ............ *C09D 11/52* (2013.01); *B05B 7/0012* (2013.01); *B05B 7/0416* (2013.01); *B05B 7/262* (2013.01); *C09D 11/322* (2013.01); *C22C 28/00* (2013.01); *H05K 3/125* (2013.01); *H05K 2203/1344* (2013.01)

(58) Field of Classification Search
CPC .................................................. H05K 1/097
USPC ................................. 252/500; 106/31.92
See application file for complete search history.

(56) References Cited

U.S. PATENT DOCUMENTS

| | | | |
|---|---|---|---|
| 2,864,695 | A | 12/1958 | Smith |
| 4,659,384 | A | 4/1987 | Daigo |
| 5,792,236 | A | 8/1998 | Taylor |
| 5,800,060 | A | 9/1998 | Speckbfrock |
| 6,019,509 | A | 2/2000 | Speckbrock |

(Continued)

OTHER PUBLICATIONS

Dickey et al., "Eutectic Gallium-Indium (EGaIn): A Liquid Metal Alloy for the Formation of Stable Structures in Microchannels at Room Temperature," Adv. Funct. Mater. 2008, 18, 1097-1104.

(Continued)

*Primary Examiner* — Khanh T Nguyen
(74) *Attorney, Agent, or Firm* — AFMCLO/JAZ; James McBride

(57) ABSTRACT

A method for forming a conductive trace on a substrate. A metallic liquid is mixed with a solvent to produce a metallic liquid mixture. The metallic liquid mixture is stimulated to produce a colloidal suspension of discrete metallic liquid particles surrounded by the solvent. The colloidal suspension is aerosolized with a carrier gas, and passed through a nozzle to deposit the discrete metallic liquid particles onto the substrate. The deposited discrete metallic liquid particles are annealed, thereby producing the conductive trace. The conductive trace has a substantially contiguous core of the metallic liquid within a substantially non-electrically conductive solid skin that substantially bounds the liquid core.

14 Claims, 6 Drawing Sheets

(56) References Cited

U.S. PATENT DOCUMENTS

| | | |
|---|---|---|
| 6,544,353 B2 | 4/2003 | Bonneviot |
| 8,329,501 B1 | 12/2012 | Robinson |
| 2008/0236444 A1 | 10/2008 | Enciu |
| 2009/0260670 A1 | 10/2009 | Li |
| 2014/0051242 A1 | 2/2014 | Lockett |
| 2014/0147959 A1 | 5/2014 | Raccurt |
| 2018/0242451 A1* | 8/2018 | Chopra .................. H05K 1/097 |

OTHER PUBLICATIONS

Dickey, "Emerging Applications of Liquid Metals Featuring Surface Oxides," A dx.doi.org/10.1021/am5043017 | ACS Appl. Mater. Interfaces, Received: Jul. 2, 2014, Accepted: Sep. 17, 2014.

Zheng et al., "Personal electronics printing via tapping mode composite liquid metal ink delivery and adhesion mechanism," Scientific Reports | 4 : 4588 | DOI: 10.1038/srep04588.

* cited by examiner

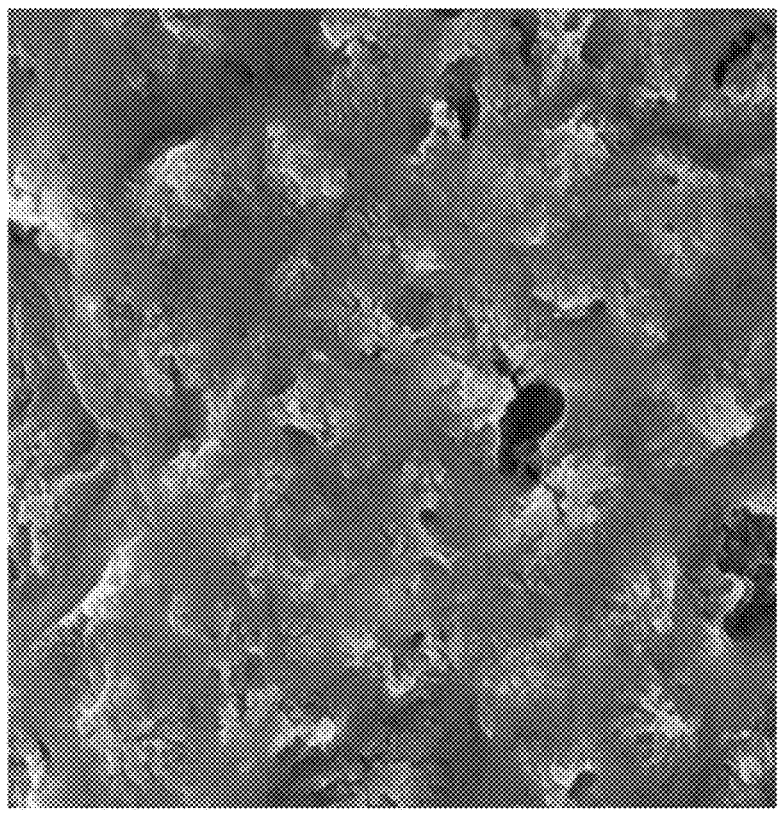
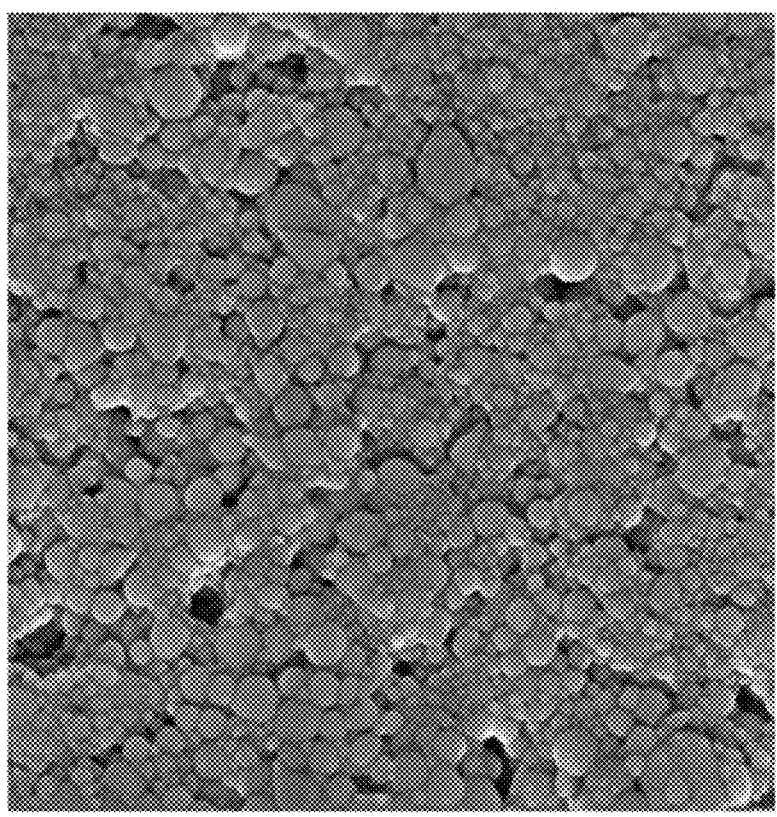

LIQUID METAL INK

GOVERNMENT INTEREST

The invention described herein may be manufactured, used, and licensed by or for the Government of the United States for all governmental purposes without the payment of any royalty.

FIELD

This invention relates to the field of liquid metal inks and printing conductive traces with such, and more particularly to gallium liquid metal inks.

BACKGROUND OF THE INVENTION

Flexible and stretchable electronics are complete electronic circuits that have the ability to undergo reversible deformation while maintaining their intended functionality. The recent surge in flexible and stretchable electronics research and development has compelled researchers to come up with novel materials and processes that are well-suited for the advancement of this field.

Current state-of-the-art approaches to fabricating conductors that can survive elastic stretching involve an island-plus-serpentine approach, wherein rigid (non-stretching) electrical components are connected electrically using meandering (serpentine) solid metal interconnects. By employing this type of curved geometry to fabricate the device interconnects, localized strains are reduced, resulting in an overall device elasticity that exceeds that of the conducting metals in their bulk form. However, serpentine patterns require more real estate in the device layout, higher stretching can only be achieved where interconnects are not bonded to the substrate, and interconnects are prone to failure after repeated stretching cycles.

Eutectic blends of gallium-indium and gallium-indium-tin have also been investigated, because these room temperature liquid metal alloys are inherently stretchable, non-toxic, and have excellent conductivity. These have been used in strain gauges, stretchable capacitors, reconfigurable antennas, and self-healing circuits.

Direct-write and inkjet printing have been used to pattern gallium liquid metal alloys in different configurations and on various rigid and flexible substrates. However, high resolution features and non-planar substrate deposition have proved to be particularly challenging. Additionally, jetting techniques such as inkjet printing and aerosol jet printing, produce non-conducting gallium liquid metal alloy films that are made up of electrically-isolated, oxide-shell-stabilized, micro- and nano-particles.

What is needed, therefore, is at least one of an ink and a deposition system that reduces issues such as those described above, at least in part.

BRIEF SUMMARY OF THE INVENTION

In the embodiments presented herein, gallium liquid metal alloy inks are formulated that can be readily atomized and deposited, such as by using an aerosol jet deposition system. In addition to gallium liquid metal alloy ink formulation and deposition, a technique is presented wherein gallium liquid metal alloy films that have been deposited by aerosol jet can be sintered to convert the films from highly insulating to highly conductive.

The above and other needs are met by a method for forming a conductive trace on a substrate. A metallic liquid is mixed with a solvent to produce a metallic liquid mixture. The metallic liquid mixture is stimulated to produce a colloidal suspension of discrete metallic liquid particles surrounded by the solvent. The colloidal suspension is aerosolized with a carrier gas, and passed through a nozzle to deposit the discrete metallic liquid particles onto the substrate. The deposited discrete metallic liquid particles are annealed, thereby producing the conductive trace. The conductive trace has a substantially contiguous core of the metallic liquid within a substantially non-electrically conductive solid skin that substantially bounds the liquid core.

In some embodiments according to this aspect of the invention, the metallic liquid comprises gallium. In some embodiments, the metallic liquid comprises an alloy of gallium and indium. In some embodiments, the conductive trace is annealed within a desired temperature range, a desired time range, and a desired pressure range. In some embodiments, stimulating the metallic liquid mixture includes ultrasonic vibration of the mixture.

In some embodiments, the solvent comprises absolute ethanol. In some embodiments, the solvent comprises dimethyl sulfoxide. In some embodiments, the solvent comprises a mixture of absolute ethanol and dimethyl sulfoxide. In some embodiments, the mixture of absolute ethanol to dimethyl sulfoxide is a ratio of about three to one, respectively.

In some embodiments, the desired temperature range is no less than about 500 centigrade. In some embodiments, the desired time range is no less than about five minutes. In some embodiments, the desired pressure range is from about $10^{-7}$ millibar to about one atmosphere. In some embodiments, the step of annealing the metallic material is performed in a substantially non-oxidizing environment. In some embodiments, the substantially non-electrically conductive solid skin comprises an oxide of the metallic material that forms in an oxygen-containing environment.

According to another aspect of the invention, there is described a method for forming a conductive trace. A metallic material is aerosol jetted on a substrate. The metallic material is a colloidal suspension of a eutectic mixture of gallium and indium in a solvent base of three parts absolute ethanol to one part dimethyl sulfoxide. The metallic material is annealed within a desired temperature range of no less than about 500 centigrade, a desired time range of no less than about five minutes, and a desired pressure range of from about $10^{-7}$ millibar to about one atmosphere, thereby producing the conductive trace. The conductive trace has a substantially contiguous, electrically conductive liquid core within a substantially non-electrically conductive solid skin that substantially bounds portions of the liquid core that have been exposed to oxygen, wherein the substantially non-electrically conductive solid skin is an oxide of the metallic material.

According to yet another aspect of the invention, there is described a conductive trace on a substrate. The conductive trace includes a substantially contiguous, electrically conductive liquid core, and a substantially non-electrically conductive solid skin that substantially bounds the liquid core.

In some embodiments, the electrically conductive liquid core comprises gallium. In some embodiments, the electrically conductive liquid core comprises an alloy of gallium and indium. In some embodiments, the non-electrically conductive solid skin comprises an oxide of the liquid core. In some embodiments, the electrically conductive liquid core comprises a eutectic mixture of gallium and indium and the non-electrically conductive solid skin comprises an oxide of the liquid core.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 4A is a representation of a micrograph of liquid metal ink after printing, but before annealing, according to an embodiment of the present invention.

FIG. 4B is a representation of a micrograph of liquid metal ink after annealing, according to an embodiment of the present invention.

DETAILED DESCRIPTION OF THE INVENTION

Ink Formulation

Figure 5:
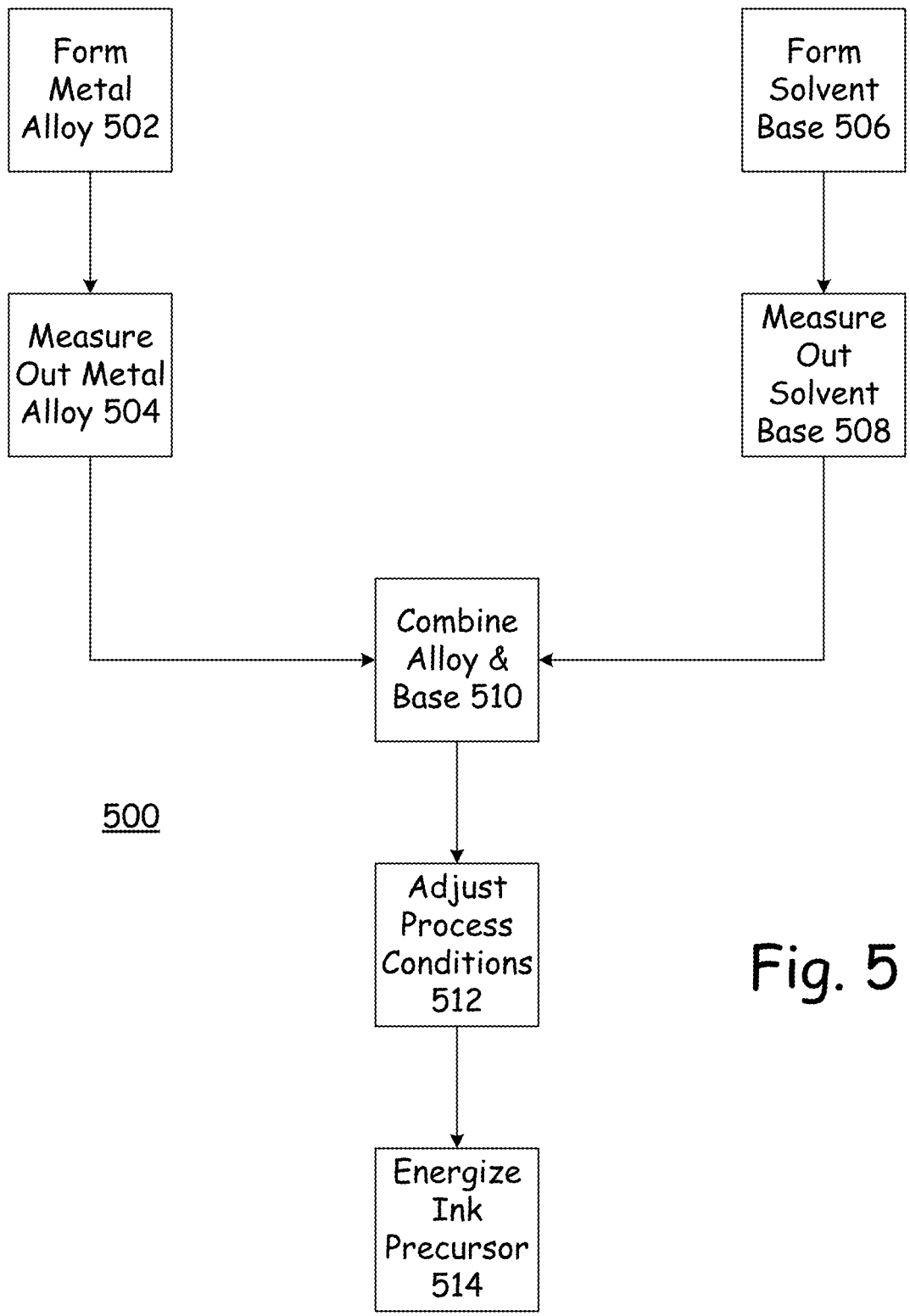
FIG. 5 is a flow-chart of a method of formulating a liquid metal ink according to an embodiment of the present invention.

Below are described different embodiments for the formulation of a liquid gallium ink, as generally described in reference to the method 500 as depicted in FIG. 5.

In some embodiments, eutectic gallium-indium (about 75.5% gallium and about 24.5% indium by weight) is formed as given in step 502. A volumetric mixture of about three parts of absolute ethanol and about one part of dimethyl sulfoxide is formed, as given in step 506, in a twenty-milliliter glass vial. About five weight percent eutectic gallium-indium is measured out as given in step 504, and about fifteen milliliters of the solvent is measured out as given in step 508, and the components are combined as given in step 510. A eutectic gallium-indium emulsion or suspension is created by dispersing the liquid metal in the solvents, such as by ultrasonic agitation, as given in step 514.

In one embodiment, a liquid processor equipped with a ³⁄₁₆″ tapered microtip probe is inserted into the mixture to disperse the liquid metal in the solvents. In some embodiments the probe is pulsed in the sample for five seconds on, then one second off, in a repeated pattern. Probe sonication intensities and overall probe sonication durations are varied in some embodiments to produce inks having different colloidal particle sizes and size distributions. Longer and higher sonication tends to produce smaller sizes and a smaller range of different sizes. During processing of some embodiments, as depicted in step 512, the mixtures are held at a relatively constant temperature of about 5° C., such as by partially submerging the vial in a magnetically stirred bath in a jacketed beaker, which is fed by a circulating chiller.

According to the embodiments of the disclosure, the probe tip creates acoustic waves in the surrounding media of such intensity that give rise to the creation and subsequent implosion of small bubbles (cavitation). These cavitations can impart sufficient energy to cleave the liquid metal, and a continual formation of smaller and smaller droplets of the liquid metal within the solvent mixture can result until nanoparticles of the liquid metal are formed.

Figure 1:
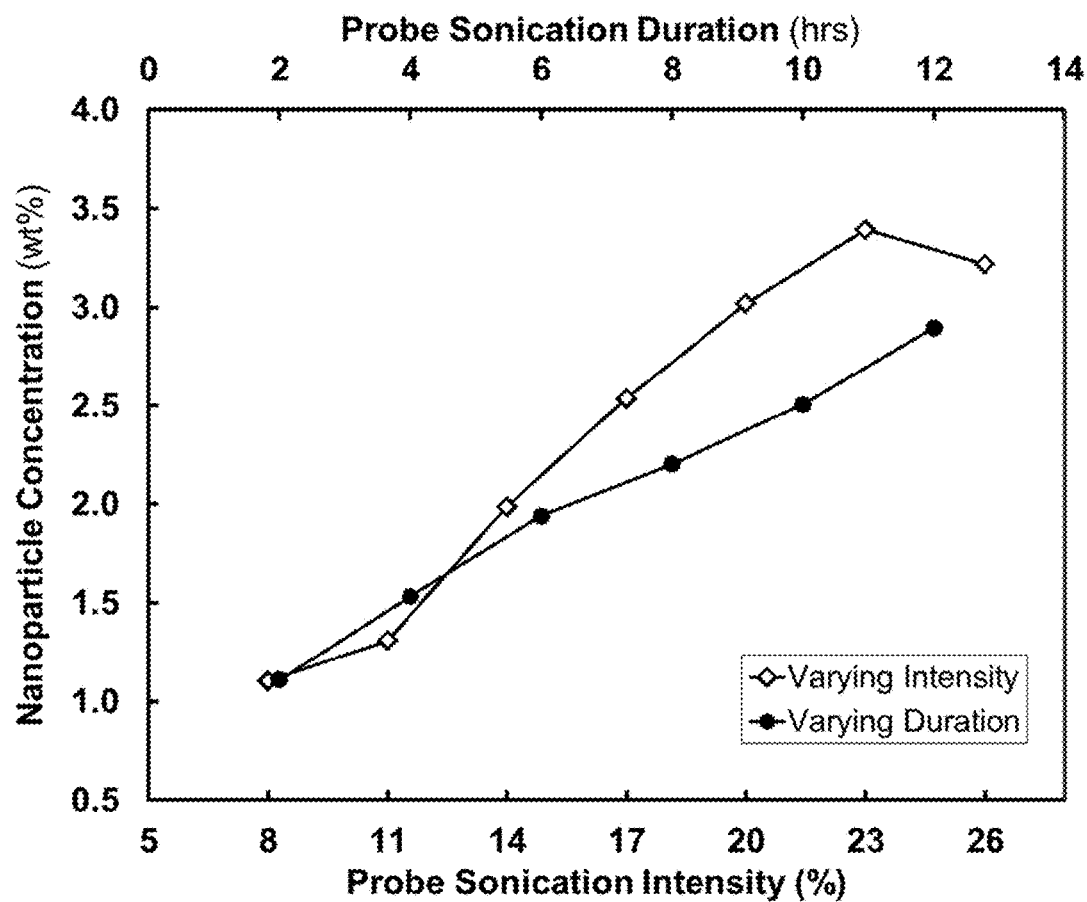
FIG. 1 is a chart of the effect of probe sonication conditions on liquid metal ink nanoparticle concentration, according to an embodiment of the present invention.
Figure 2:
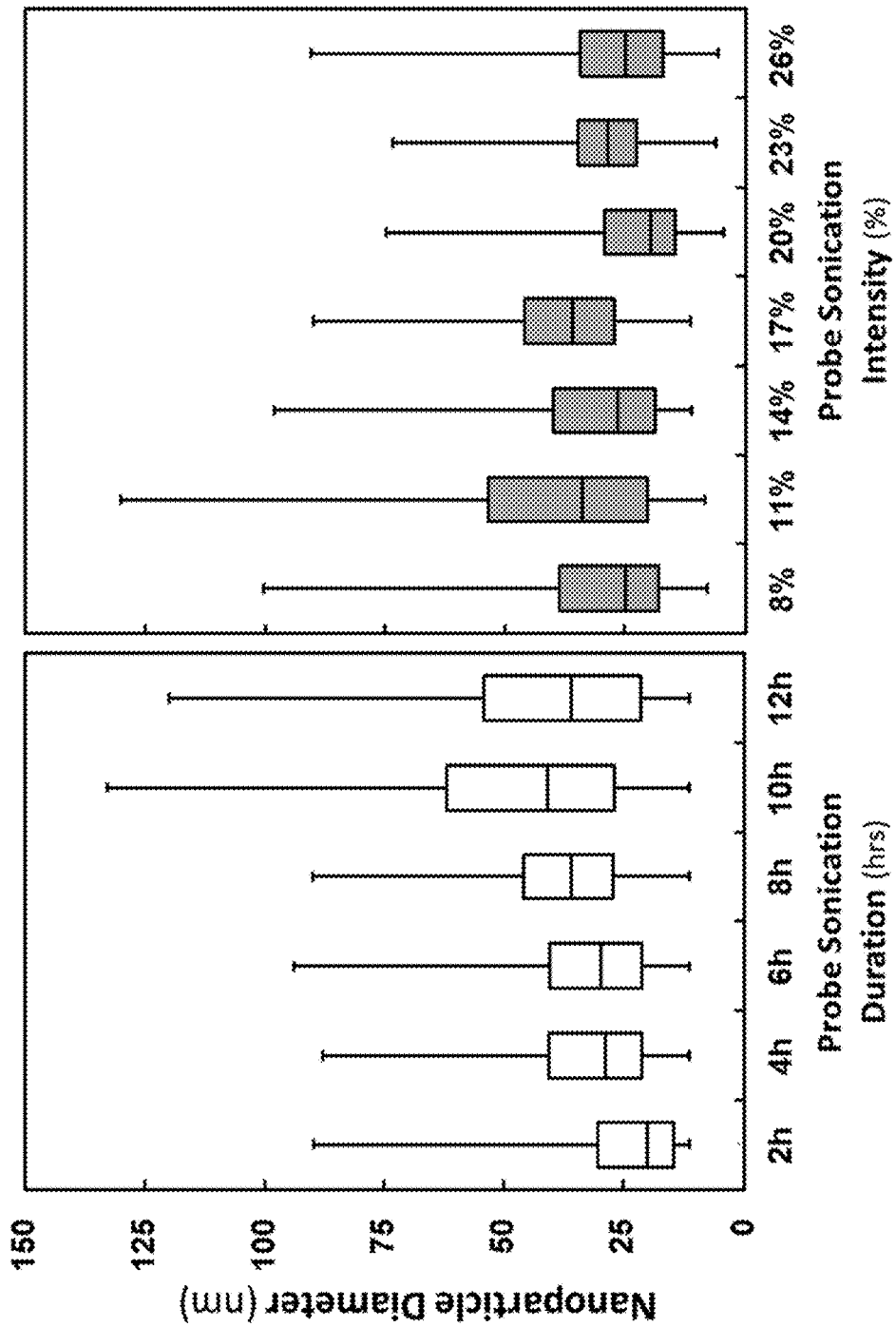
FIG. 2 is chart of the effect of probe sonication conditions on liquid metal ink nanoparticle size, according to an embodiment of the present invention.

The average liquid metal particle size is decreased in a generally linear manner with longer probe sonication durations, as depicted in FIGS. 1 and 2. As each new liquid metal droplet is created, a thin metal-oxide shell forms around the droplet, which stabilizes the droplet and prevents it from coalescing with other nearby droplets.

After ultrasonic processing, the gallium liquid metal alloy colloidal suspensions are transferred to centrifuge tubes, where they are spun at about 500 rotations per minute for about an hour, to precipitate the larger eutectic gallium-indium particles. After centrifugation, about eight milliliters of supernatant is decanted from the samples and kept as the gallium liquid metal alloy ink. The supernatant tends to have the smaller particles that stay in suspension, thus lengthening the shelf life of the ink and providing a more uniform deposition, in some embodiments.

The concentration of the gallium liquid metal alloy ink can be determined using the following process: Directly after decantation of the ink, four samples of about 200 microliters each are dispensed into each of four one-milliliter pre-weighed and pre-fired autosampler vials. After dispensing, the mass of each of the ink aliquots is measured. The solvent is subsequently driven off by oven firing at a temperature of about 165° C. for about an hour and a half, and the mass of the residue is measured.

Ink Printing

Figure 3:
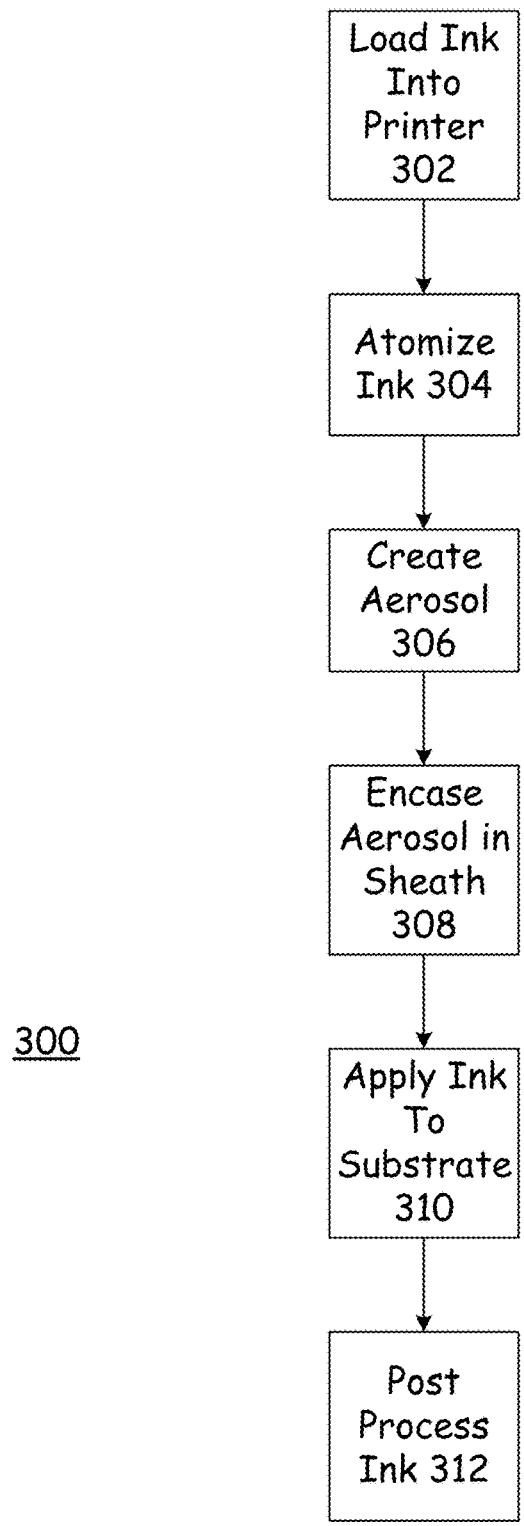
FIG. 3 is a flow-chart of a method of printing a liquid metal ink according to an embodiment of the present invention.

The general method 300 of printing the ink as formulated above is described with reference to FIG. 3. In some embodiments, an aerosol jet printer is used to deposit the ink onto the desired substrate.

In some embodiments, the ink is loaded into the aerosol jet printer, as given in step 302, and the ink is atomized using either ultrasonic or pneumatic processes, as given in step 304. Micron-sized droplets of the atomized ink are then picked up with an inert carrier gas to produce a fine mist or aerosol, as given in step 306. The aerosol is conducted to a nozzle, where a sheath gas flow is introduced around the periphery of the carrier gas flow to aerodynamically focus and collimate the aerosol stream of ink-entrained gas as it exits the nozzle, as given in step 308, and is applied to the desired substrate, as given in block 304.

The carrier and sheath gas flows are varied to control the deposition rates and feature sizes (as generally known in the art), which in some embodiments range from hundreds of microns to about ten microns. The delivery of atomized ink to the nozzle is continuous in some embodiments, and in such embodiments a mechanical shutter can be used to programmatically disrupt the flow of the aerosol in order to create complex patterns.

In some embodiments, gallium liquid metal alloy inks are atomized and deposited with an Optomec AJ300-UP aerosol jet deposition system that uses ultrasonic atomization to produce the ink aerosol from one milliliter aliquots. In some embodiments, samples are deposited using a 300 micron nozzle. In some embodiments the ink is kept at a temperature of about 30° C., and the substrates are kept at a temperature of about 100° C. during the deposition process.

In the presence of oxygen (such as in air) gallium liquid metal alloys, such as are present in the inks described herein, tend to form a thin (1-2 nanometer) gallium oxide ($Ga_2O_3$) skin on the surface of the ink nanoparticles, which largely dictates the electrical and other attributes of the ink. The presence of the oxide film acts to stabilize the liquid metal droplets such that they are able to maintain small (millimeter or less), free-standing structures that readily stick to various substrates. Unfortunately, the spontaneous formation of oxide on the surface of the nanoparticles results in printed features that are substantially electrically non-conductive.

Ink Annealing

To overcome this obstacle in forming electrically conductive traces using the aerosol-printed inks as described herein, the as-deposited inks are post-processed in some embodiments, as given in step 312. For example, in some embodiments the deposited inks are annealed or sintered, using various processing conditions, as described in more detail below.

For the sintering process, the substrates with the deposited structures are placed in an oven or furnace, such as a vacuum furnace. In some embodiments, an ambient environment other than air or vacuum is present in the furnace, such as a non-oxidizing environment such as nitrogen or argon. For those embodiments where a vacuum is drawn, the furnace is closed and the pressure is reduced within the furnace, such as with one or more of a combination of mechanical pumps, diffusion pumps, cryogenic pumps, and turbomolecular pumps. In these embodiments, the pressure is reduced to no less than a pressure of about $10^{-7}$ milliTorr.

Once the desired pressure has been established, the temperature of the furnace is increased. In some embodiments both a timed ramp-up and a timed ramp-down to and from the setpoint temperature is used. In some embodiments both the ramp-up time and ramp-down time are about two hours. In other embodiments, the ramp-up time and ramp-down time are different, one from another, and longer or shorter than two hours.

In some embodiments the ramp-down from the desired temperature is initiated as soon as the ramp-up to the desired temperature has been completed. In some embodiments there is a dwell time at the desired temperature. For example, some dwell times would be five minutes, sixty minutes, or even more before the ramp-down is initiated. The dwell time is considered to be the desired length of time at the sintering temperature.

EXAMPLES

In some embodiments, sintering of the deposited ink structures is performed at the following conditions, which yield the indicated conductivity of the printed ink:

| Run # | Temperature ° C. | Pressure mBar | Environment | Time Min's | Conductivity S/cm | % Cond. |
|---|---|---|---|---|---|---|
| 1 | 24 | Atmospheric | Air | n/a | | 0 |
| 2 | 500 | Atmospheric | Air | 0 | $2(10^{-4})$ | 0 |
| 3 | 800 | $10^{-6}$ | Vacuum | 0 | Melted | n/a |
| 4 | 500 | $10^{-6}$ | Vacuum | 0 | $3(10^3)$ | 10 |
| 5 | 383 | $10^{-6}$ | Vacuum | 0 | $10^{-8}$ | 0 |
| 6 | 383 | $10^{-6}$ | Vacuum | 240 | $3(10^{-7})$ | 0 |
| 7 | 500 | Atmospheric | Argon | 0 | 4 | 0 |

-continued

| Run # | Temperature ° C. | Pressure mBar | Environment | Time Min's | Conductivity S/cm | % Cond. |
|---|---|---|---|---|---|---|
| 8 | 500 | Atmospheric | Argon | 60 | 0.2 | 0 |
| 9 | 500 | $10^{-6}$ | Vacuum | 30 | $3(10^3)$ | 10 |
| 10 | 500 | $10^{-6}$ | Vacuum | 60 | $2(10^3)$ | 6 |
| 11 | 500 | $10^{-6}$ | Vacuum | 75 | $2(10^3)$ | 6 |
| 12 | 500 | $10^{-6}$ | Vacuum | 90 | $2(10^3)$ | 6 |

As can be seen from this table, annealing in a vacuum for any length of time at a temperature of 500° C. produced usable conductivities in the samples. There is some data to support that the embodiments where the sample was not held at the ultimate temperature for longer than thirty minutes, before ramping down the temperature, produced the best conductivities.

Figure 6A:
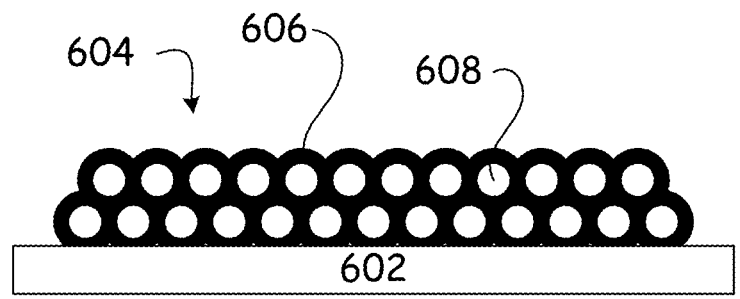
FIG. 6A is a representation of a cross-section of liquid metal ink after printing, but before annealing, according to an embodiment of the present invention.
Figure 6B:
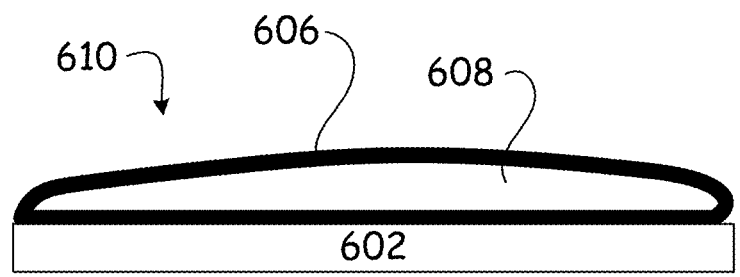
FIG. 6B is a representation of a cross-section of liquid metal ink after annealing, according to an embodiment of the present invention.

FIGS. 4 and 6 represent the printed ink prior to post-processing (FIGS. 4A and 6A) and after post-processing (FIGS. 4B and 6B), according to the conditions represented by Run #1 in the table above. FIG. 4 represents micrographs of a top view of the structure, and FIG. 6 represents diagrammatic cross-sections of the structure.

The as-deposited structure of FIGS. 4A and 6A is substantially electrically non-conductive. However, the post-processed structure of FIGS. 4B and 6B is substantially electrically conductive.

As can be seen by comparing the two micrographs 4A and 4B, the as-deposited nanoparticles as depicted in FIG. 4A have coalesced to some degree during the post-processing, to form the substantially contiguous sheet as depicted in FIG. 4B. In other words, the oxide shells that form around each nanoparticle of ink have rearranged during post processing, such that the oxide shell exists at the surfaces of the ink deposit, but the interior of the printed ink structure is substantially completely formed of the deposited liquid metal, with no intervening oxide.

Similarly, with respect to FIGS. 6A and 6B, the structure 604 as deposited on the substrate 602 is formed of ink nanoparticles, with oxide shells 606 and liquid metal centers 608. After post-deposition-processing, the nanoparticles 604 generally coalesce into a structure 610 with a substantially contiguous liquid metal core 608 that is substantially completely bounded with an oxide shell 606. In this manner, the liquid metal core freely conducts an electrical charge that is passed through it.

Further, the deposited structure is able to conduct an electrical charge even when the substrate 602 on which it is formed is bent, flexed, twisted, stretched, or otherwise deformed. During such mechanical deformation, the oxide exterior of the deposited structure might crack, but then reforms nearly instantaneously. The liquid center, which is predominantly the charge-conducting portion of the structure, remains flexible and conductive during such deformations.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. A method for forming a conductive trace on a substrate, the method comprising the steps of:
   - combining a metallic liquid comprising gallium with a solvent to produce a metallic liquid mixture,
   - stimulating the metallic liquid mixture to produce a colloidal suspension of discrete metallic liquid particles surrounded by the solvent,
   - aerosolizing colloidal suspension with a carrier gas, and
   - passing the aerosolized colloidal suspension through a nozzle to deposit the discrete metallic liquid particles onto the substrate, and
   - annealing the deposited discrete metallic liquid particles,
   - thereby producing the conductive trace, where the conductive trace has a contiguous core of the metallic liquid within a solid skin having an electrical conductivity of less than 1 S/cm that bounds the liquid core.

2. The method of claim 1, wherein the metallic liquid comprises an alloy of gallium and indium.

3. The method of claim 1, further comprising annealing the conductive trace within a desired temperature range, a desired time range, and a desired pressure range.

4. The method of claim 3, wherein the desired temperature range is no less than about 500 centigrade.

5. The method of claim 3, wherein the desired time range is no less than about five minutes.

6. The method of claim 3, wherein the desired pressure range is from about 10' millibar to about one atmosphere.

7. The method of claim 1, wherein stimulating the metallic liquid mixture comprises ultrasonic vibration of the mixture.

8. The method of claim 1, wherein the solvent comprises absolute ethanol.

9. The method of claim 1, wherein the solvent comprises dimethyl sulfoxide.

10. The method of claim 1, wherein the solvent comprises a mixture of absolute ethanol and dimethyl sulfoxide.

11. The method of claim 10, wherein the mixture of absolute ethanol to dimethyl sulfoxide is a ratio of about three to one, respectively.

12. The method of claim 1, wherein the step of annealing the metallic material is performed in a non-oxidizing environment having a pressure of $1\times10^{-6}$ mBar or less.

13. The method of claim 1, wherein the non-electrically conductive solid skin comprises an oxide of the metallic material that forms in an oxygen-containing environment.

14. A method for forming a conductive trace, the method comprising the steps of:
   - aerosol jetting a metallic material on a substrate, where the metallic material is a colloidal suspension of a eutectic mixture of gallium and indium in a solvent base of three parts absolute ethanol to one part dimethyl sulfoxide,
   - annealing the metallic material within a desired temperature range of no less than about 500 centigrade, a desired time range of no less than about five minutes, and a desired pressure range of from about $10^{-7}$ millibar to about one atmospheric,
   - thereby producing the conductive trace, where the conductive trace has a contiguous, electrically conductive liquid core within a non-electrically conductive solid skin having an electrical conductivity of less than 1 S/cm that substantially bounds portions of the liquid core that have been exposed to oxygen, wherein the non-electrically conductive solid skin comprises an oxide of the metallic material.

* * * * *